(12) United States Patent
Matsumura

(10) Patent No.: US 6,322,433 B1
(45) Date of Patent: Nov. 27, 2001

(54) GRINDING CHIP

(76) Inventor: Makoto Matsumura, 31-18, Shinmachi 1-chome, Ome-shi, Tokyo 198-0024 (JP)

(*) Notice: Subject to any disclaimer, the term of this patent is extended or adjusted under 35 U.S.C. 154(b) by 0 days.

(21) Appl. No.: 09/509,057

(22) PCT Filed: Jul. 22, 1999

(86) PCT No.: PCT/JP99/03933

§ 371 Date: Mar. 20, 2000

§ 102(e) Date: Mar. 20, 2000

(87) PCT Pub. No.: WO00/05595

PCT Pub. Date: Mar. 2, 2000

(30) Foreign Application Priority Data

Jul. 24, 1998 (JP) .................................................. 10-209998

(51) Int. Cl.⁷ ............................................................. B24B 19/00
(52) U.S. Cl. ................................ 451/415; 451/28; 451/490
(58) Field of Search ............................ 329/755, 754, 329/757; 439/66, 68; 451/415, 28, 90; 15/210.1, 209.1; 360/128

(56) References Cited

U.S. PATENT DOCUMENTS

| | | |
|---|---|---|
| 5,177,906 | 1/1993 | Balding et al. . |
| 5,201,093 | 4/1993 | Wells et al. . |
| 5,729,147 | 3/1998 | Schaff . |
| 6,072,323 * | 6/2000 | Hembree ............................ 324/755 |
| 6,072,324 * | 6/2000 | Farnworth ......................... 324/755 |
| 6,094,058 * | 7/2000 | Hembree ............................ 324/755 |
| 6,140,826 * | 10/2000 | Jeng .................................. 324/755 |

FOREIGN PATENT DOCUMENTS

| | | |
|---|---|---|
| 06-314899 | 11/1994 | (JP) . |
| 07-218584 | 8/1995 | (JP) . |
| 07-234262 | 9/1995 | (JP) . |
| 09-178806 | 7/1997 | (JP) . |
| 10-82826 | 3/1998 | (JP) . |
| 11-233220 | 8/1999 | (JP) . |

OTHER PUBLICATIONS

Patent Abstracts of Japan, vol. 1998, No. 08, Jun. 30, 1998 and JP 10–082826 A (Fujitsu Ltd.; Fujitsu VLSI Ltd.), Mar. 31, 1998—Abstract only.

* cited by examiner

Primary Examiner—Joseph J. Hail, III
Assistant Examiner—Daniel Shanley

(57) ABSTRACT

A polishing chip has its outer shape substantially the same as that of a semiconductor device, and is arranged to be mounted and dismounted to and from a semiconductor-device receiving socket (11) installed in a testing apparatus for evaluation of semiconductor devices. Distal end portions (15b) of contact pins (15) of the socket are brought in contact with an abrasive layer (22) formed in distal end portions of the polishing chip mounted to the socket, whereby distal ends of the contact pins are polished to remove foreign substances therefrom.

13 Claims, 11 Drawing Sheets

GRINDING CHIP

TECHNICAL FIELD

The present invention relates to a polishing chip for polishing contact pins of a semiconductor-device-receiving socket installed in a testing apparatus for evaluating characteristics of semiconductor devices, to thereby remove foreign substances adhered thereto.

BACKGROUND OF THE INVENTION

Testing apparatuses for evaluating semiconductor devices are equipped with sockets for receiving semiconductor devices. Depending on types of semiconductor devices and types of evaluation testing (burn-in test, prober test, final test or the like), a variety of types of sockets are employed. For instance, ICs, which are typical of semiconductor devices, may be of a type having lead pins thereof extending downward from a lower face of an IC body. For this kind of ICs, an IC socket having an IC mounting section is employed. The IC mounting section is provided in an upper face of the socket to which a lower face of the IC is joined. Such an IC mounting section generally includes pairs of contact pieces which are the same in number as IC lead pins. In mounting the IC to the IC socket, each IC lead pin is inserted between a corresponding pair of contact pieces. For another type of ICs having lead pieces extending laterally from side faces of an IC body, an IC socket having an IC socket body provided at its central part with an IC accommodation space is employed. The IC socket of this kind typically includes contact pieces disposed around the IC accommodation space. The contact pieces are the same in number to the IC lead pieces. Distal end portions of the contact pieces extend obliquely downward from above the IC, received in the accommodation space, toward the IC lead pieces. In mounting the IC to the IC socket, a lid member of the IC socket, disposed to face the IC inserted into the accommodation space of the socket body, is moved toward the IC, causing the distal end portions of the contact pieces to move downward. Distal end faces of the contact pieces are brought in contact with upper flat faces of the distal end portions of the IC lead pieces, whereby electrical connection between the IC and the IC socket is established.

Foreign substances, such as dust flying from the outside and solder peeling off IC leads, are liable to adhere to contact pieces or contact pins (hereinafter referred to as contact pins) of the IC socket. Foreign substances adhered thereto cause contact failure or electrical short-circuit between the IC leads and the contact pins, preventing intended evaluation testing. Thus, foreign substance removal process, such as blowing of pressurized air to the contact pins, is implemented before mounting the IC to the IC socket. However, it is difficult to fully remove minute foreign substances from the contact pins.

Generally, the lead pieces or the lead pins (hereinafter referred to as IC leads) of the IC are plated with solder, and the contact pins of the IC socket are plated with gold. To carry out the evaluation testing, ICs serving as testing objects are sequentially mounted to the IC socket. When the IC leads are in contact with the contact pins of the IC socket, solder is transferred from the IC leads to the contact pins. As the evaluation testing is implemented in respect of a number of ICs, the transition of solder from the IC leads to the contact pins is repeated, so that deposition of solder on the surfaces of the contact pins gradually progresses, and solder components diffuse into the gold-plated surfaces of the contact pins, forming a diffusion layer therein. With elapse of time, the diffusion layer is subject to oxidization, forming an oxide film layer which increases the electrical resistance between the contact pins and the leads. The formation of the oxide film layer progresses with the increase in number of times of using the IC socket, so that normally operable ICs may be erroneously determined as faulty products in the evaluation testing.

To remove foreign substances such as solder or oxide film adhered to the contact pins of the IC socket, cleaning such as air-blowing, ultrasonic-cleaning, or brushing is implemented when the IC socket is used a predetermined number of times or for a predetermined time period. However, by means of cleaning of these kinds, it is difficult to fully remove the foreign substances.

This necessitates early replacement of the IC socket which is high-priced. Upon replacement of the IC socket, a printed circuit board on which the IC socket is mounted must be generally detached from the testing apparatus, together with the IC socket. A lot of time is required to dismount the IC socket from the printed circuit board and to mount a new IC socket thereon. Thus, backup printed circuit boards each mounted with an IC socket must be prepared to continuously operate the testing apparatus.

JP-A-10-82826 discloses a cleaning technique other than the above-mentioned techniques such as air-blowing. A cleaning method and apparatus disclosed therein are applied solely to cleaning of IC sockets of a type adapted for ICs each having lead pins extending from the lower face of its body. The IC socket of this kind has pairs of contact pieces provided on its face at which it is joined to the IC. Each contact piece pair permits a corresponding IC lead pin to be detachably inserted therebetween. In the cleaning, a cleaning head instead of the IC serving as a testing object is moved from above the IC socket and is joined to the upper face of the IC socket. Each cleaning pin (file-like grinding portion) of the cleaning head is inserted between a corresponding contact piece pair of the IC socket, to remove foreign substances adhered thereto. In this manner, the cleaning technique disclosed in the above-mentioned publication teaches technical concept for removing foreign substances adhered to the contact pieces in term of grinding. However, this cleaning technique is solely applicable to the cleaning of IC sockets suited to ICs having lead pins extending from the lower face of the IC body. Since the cleaning head comprises the cleaning pins which are formed with file-like grinding portions and which are the same in number to the IC lead pins, the cleaning head is not simple in construction and is hence high-priced. In addition, the contact pieces of the IC socket can be excessively worn in term of grinding by means of the file-like grinding portions.

In an apparatus and method disclosed in JP-A-6-314899 for mounting and dismounting a semiconductor device, an IC is transferred, before being mounted on an IC socket, toward a cleaning board which is separate from and disposed to face a testing board (testing apparatus) mounted with the IC socket. By doing this, IC leads are in contact with a file layer formed in the cleaning board, whereby foreign substances adhered thereto are removed. The apparatus and method disclosed in this publication merely contemplate cleaning IC leads, and are not applicable to removal of foreign substance from the contact pins of the IC socket. Further, the IC is required to be positioned on the cleaning board for removal of foreign substances and then positioned on the IC socket, so that a positioning control is not simple. Furthermore, the cleaning board and an installation space therefor are required. This increases cleaning costs. In addition, even if this cleaning technique could be applied to the removal of foreign substances from the contact pins, the IC socket is still required to be dismounted from the testing apparatus upon removal of foreign substances. The need of dismounting the IC socket entails the above-mentioned drawbacks. Further, the cleaning using a file layer may excessively wear the contact pins of the IC socket.

JP-A-7-234262 discloses a method and apparatus for cleaning an IC socket in which the IC socket having been employed for evaluation testing is dismounted from a testing apparatus, and then electrodes (contact pins) of the IC socket are immersed into acidic medical fluid, to thereby remove solder adhered to the electrodes. The cleaned IC socket is mounted to the testing apparatus. According to this IC socket cleaning technique, the IC socket must be detached from the testing apparatus upon removal of solder from the contact pins. Moreover, in order to chemically remove the adhered solder with use of medical fluid, a large-scale arrangement is generally required.

DISCLOSURE OF THE INVENTION

An object of the present invention is to provide, at low costs, a polishing chip capable of easily and sufficiently removing foreign substances adhered to contact pins of a semiconductor-receiving socket installed in a testing apparatus employed for evaluation of semiconductor devices.

In order to achieve the object, according to the present invention, there is provided a polishing chip detachably mounted to a semiconductor-device mounting section of a socket installed in a testing apparatus for evaluating semiconductor devices. The socket for use with the polishing chip includes a plurality of contact pins which are disposed for contact with a plurality of leads of a semiconductor device mounted to the semiconductor-device mounting section of the socket.

The polishing chip of the present invention comprises a polishing chip body corresponding to a body of the semiconductor device, and a polishing chip extension having an abrasive layer and corresponding to the plurality of leads of the semiconductor device. The polishing chip body has a planar shape thereof substantially the same as a planar shape of the semiconductor device and has a height which is substantially equal to or less than a height of the semiconductor device. The polishing chip extension has a planar shape thereof substantially the same as a planar shape of a whole of the plurality of leads of the semiconductor device. When the polishing chip is mounted to the semiconductor-device mounting section of the socket, the plurality of contact pins of the socket are disposed for contact with the abrasive layer of the polishing chip.

The socket installed in the testing apparatus is usually utilized to connect a number of semiconductor devices, serving as testing objects, with the testing apparatus in sequence. For removal of foreign substances from the contact pins of the socket, the polishing chip of the present invention is mounted to the semiconductor-device mounting section of the socket. In other words, in removing foreign substances with use of the polishing chip of the present invention, no space used exclusively for the removal of foreign substances is required. In addition, the polishing chip can be easily and accurately mounted to the semiconductor-device mounting section of the socket, since the polishing chip has its planar shape substantially the same as that of the semiconductor device and has its height not higher than that of the semiconductor device. Further, the polishing chip can be mounted to the socket with use of, e.g., an automatic mounter usually employed for mounting and dismounting semiconductor devices to and from the socket. By using such an automatic mounter, no equipment adapted exclusively for mounting the polishing chip to the socket is required, and no manual operations are required in mounting the polishing chip to the socket.

When the polishing chip is mounted to the semiconductor-device mounting section of the socket, the contact pins of the socket are disposed for contact with the abrasive layer of the polishing chip. By making the contact pins to contact with the abrasive layer, the contact pins move along a surface of the abrasive layer while being kept in contact with the abrasive layer surface. That is, the contact pins slide on the surface of the abrasive layer since the contact pins generally have flexibility. By this sliding movement, the contact pins are simultaneously subject to polishing by means of the abrasive layer, so that foreign substance adhered thereto are removed. Since the planar shape of the polishing chip extension is substantially the same as that of the entirety of the plurality of leads of the semiconductor devices, in making the contact pins of the socket to contact with the abrasive layer of the polishing chip extension, the contact pins are only required that they are moved in the same manner as in a case where the contact pins are connected to the leads of the semiconductor device. Thus, no particular equipment is required to move the contact pins for abutment against the abrasive layer.

With use of the polishing chip of the present invention, the removal of foreign substances can be made in a condition that the socket is kept mounted on the testing apparatus. Accordingly, it is unnecessary to dismount the socket from the testing apparatus upon removal of foreign substances. Thus, for the removal of foreign substances, the provision of an auxiliary printed circuit board is unnecessary even for the testing apparatus of a type requiring the dismounting of a printed circuit board when the socket mounted on the printed circuit board is dismounted from the testing apparatus.

A polished degree of the contact pins by the polishing chip can be made proper since it is relatively easy to provide the abrasive layer of the polishing chip with a proper polishing ability by appropriately selecting a type of abrasive and the like. Therefore, the contact pins can be prevented from being excessively worn when foreign substances are removed therefrom, so that the durability of the socket may be improved and the service life of the socket may be prolonged.

After removal of foreign substances with use of the polishing chip of the present invention, the polishing chip is dismounted from the socket. This permits evaluation testing of semiconductor devices by use of the socket from which foreign substances are removed, so that a number of times of using the socket may be increased, reducing testing costs.

Furthermore, according to the present invention, various polishing chips suited to remove foreign substances from contact pins of sockets of various types can be provided.

In this invention, preferably, the polishing chip body has an outer shape thereof substantially the same as an outer shape of at least top-wall-side part of the semiconductor device body, and the polishing chip extension has an outer shape thereof substantially the same as an outer shape of a whole of the plurality of leads of the semiconductor device.

With this preferred polishing chip where the outer shape of the polishing chip is in its entirety substantially the same as that of the semiconductor device, the mounting of the polishing chip to the semiconductor-device mounting section by means of an automatic mounter usually utilized for mounting and dismounting semiconductor devices can be easily made, and the abutment of the contact pins against the abrasive layer can be made with ease.

Preferably, the polishing chip is fabricated by forming a sheeting having the abrasive layer.

With this preferred arrangement, the polishing chip can be fabricated at low costs by simply forming the sheeting having the abrasive layer.

In the present invention, preferably, the polishing chip is fabricated from resin material with which an abrasive is mixed. More preferably, the polishing chip body has an outer shape thereof substantially the same as an outer shape of the semiconductor device body.

According to the just-mentioned two preferable arrangements where part of the abrasive contained in surface regions, with which the contact pins are brought in contact, of the polishing chip extension serves as the abrasive layer, a process for forming the abrasive layer on the polishing chip can be simplified or eliminated, so that the polishing chip may be fabricated at low costs. By using the resin material and/or the abrasive having appropriate properties, or by adjusting a ratio between an amount of the resin material and that of the abrasive, the polished degree of the contact pins by the polishing chip can be adjusted, so that the service life of the polishing chip can be prolonged.

The polishing chip of the latter preferred arrangement having its outer shape substantially the same as that of the semiconductor device is easy to be mounted to the semiconductor-device mounting section, and makes it easy for the contact pins of the socket to be abutted against the abrasive layer.

Preferably, the polishing chip of this invention is applied to the socket to which the semiconductor device having the plurality of leads extending from side faces of the semiconductor device body is mounted. The polishing chip body has a top wall and at least one side wall formed integrally therewith. The polishing chip extension extends from the at least one side wall of the polishing chip body.

With this preferred arrangement, it is possible to provide the polishing chip suited to remove foreign substances adhered to the contact pins of the socket suitable for the semiconductor device having the leads thereof extending from side faces of its body.

More preferably, the socket includes a socket body, and a lid member disposed to face the socket body and to be movable vertically of the socket. An accommodation space for selectively receiving either the semiconductor device body or the polishing chip body is provided between the socket body and the lid member, the accommodation space constituting part of the semiconductor-device mounting section of the socket. The plurality of contact pins of the socket are disposed around the accommodation space, and have distal end portions thereof engageable with the lid member. Each contact pin is brought in contact with the abrasive layer when the lid member is moved toward the socket body in a condition that the polishing chip body is received in the accommodation space.

More preferably, the plurality of leads of the semiconductor, the polishing chip extension, and the plurality of contact pins of the socket are formed into plate shapes, respectively. The contact pins are brought in contact at their distal end faces with a flat surface of the abrasive layer of the polishing chip.

More preferably, the socket body includes a positioning portion projecting vertically of the socket from a lid-member-side face of the socket body. The positioning portion defines a lower part of the accommodation space.

According to the just-mentioned three preferable arrangements, removal of foreign substances from the contact pins can be made satisfactorily, while utilizing a lead/contact pin connecting function, in term of movement of the lid member, of the socket. Such a function is usually utilized for the mounting of the semiconductor device, having leads extending from side faces of the semiconductor device body, to the socket.

Moreover, in the just-mentioned preferred arrangement applied to the socket adapted for the semiconductor device having leads thereof extending from side faces of the semiconductor device body, preferably, the semiconductor-device mounting section of the socket includes a board on which either the semiconductor device body or the polishing chip body is selectively placed. The board has a slot formed therethrough in a thickness direction of the board. When the polishing chip body is placed on the board, the abrasive layer of the polishing chip is disposed to face the slot of the board, and the distal end portions of the plurality of contact pins of the socket are inserted into the slot and are disposed for contact with the abrasive layer.

The just-mentioned more preferable arrangement makes it possible to provide the polishing chip adapted for removal of foreign substances from the contact pins of the socket used for a final test of semiconductor devices implemented by the testing apparatus.

Preferably, the polishing chip of this invention is applied to the socket for receiving the semiconductor device having the plurality of leads consisting of lead electrodes that are formed in a grid array on a lower face of the semiconductor device body. The polishing chip body has a lower face. The polishing chip extension has a plurality of polishing portions formed in a grid array on the lower face of the polishing chip body. The plurality of polishing portions are formed with the abrasive layer.

With this arrangement, the polishing chip can be provided, which is suited to remove foreign substances from the contact pins of the socket adapted for receiving the semiconductor device having the leads thereof formed in a grid array on the lower face of the semiconductor device body.

In the just-mentioned preferred arrangement, preferably, the polishing chip is fabricated from resin material with which an abrasive is mixed. More preferably, the polishing chip body has an outer shape thereof substantially the same as an outer shape of the semiconductor device body. The polishing chip extension has an outer shape thereof substantially the same as an outer shape of a whole of the plurality of leads of the semiconductor device.

According to the just-mentioned two preferred arrangements, the polishing chip can be fabricated at low costs since the abrasive, contained in the resin material that forms a face region of the polishing chip against which the contact pins are abutted, serves as the abrasive layer and hence a process for forming the abrasive layer on the polishing chip can be simplified or eliminated. Further, by selecting a kind of the resin material and/or the abrasive or by adjusting a ratio between an amount of the resin material and that of the abrasive, excessive wear of the contact pins while being polished by the polishing chip can be prevented. In particular, upon removal of foreign substances from the socket having the contact pins whose distal ends are stuck, when connected to the semiconductor device, into lead electrodes formed in a grid array on the lower face of the semiconductor device body, foreign substances adhered to the contact pins can be properly removed without causing the distal ends of the contact pins to be excessively worn, by using the polishing chip having the polishing portions whose hardness is properly adjusted such that the contact pins can be stuck into the polishing portions respectively corresponding to the lead electrodes of the semiconductor device.

With the latter preferred arrangement, the polishing chip that is easy to be mounted to the semiconductor-device mounting section of the socket can be provided.

BEST MODE FOR CARRYING OUT THE INVENTION

In the following, a socket and a semiconductor device mounted thereto will be explained, the socket being an object of a process for removing foreign substances by use of a polishing chip according to a first embodiment of this invention.

Figure 1:
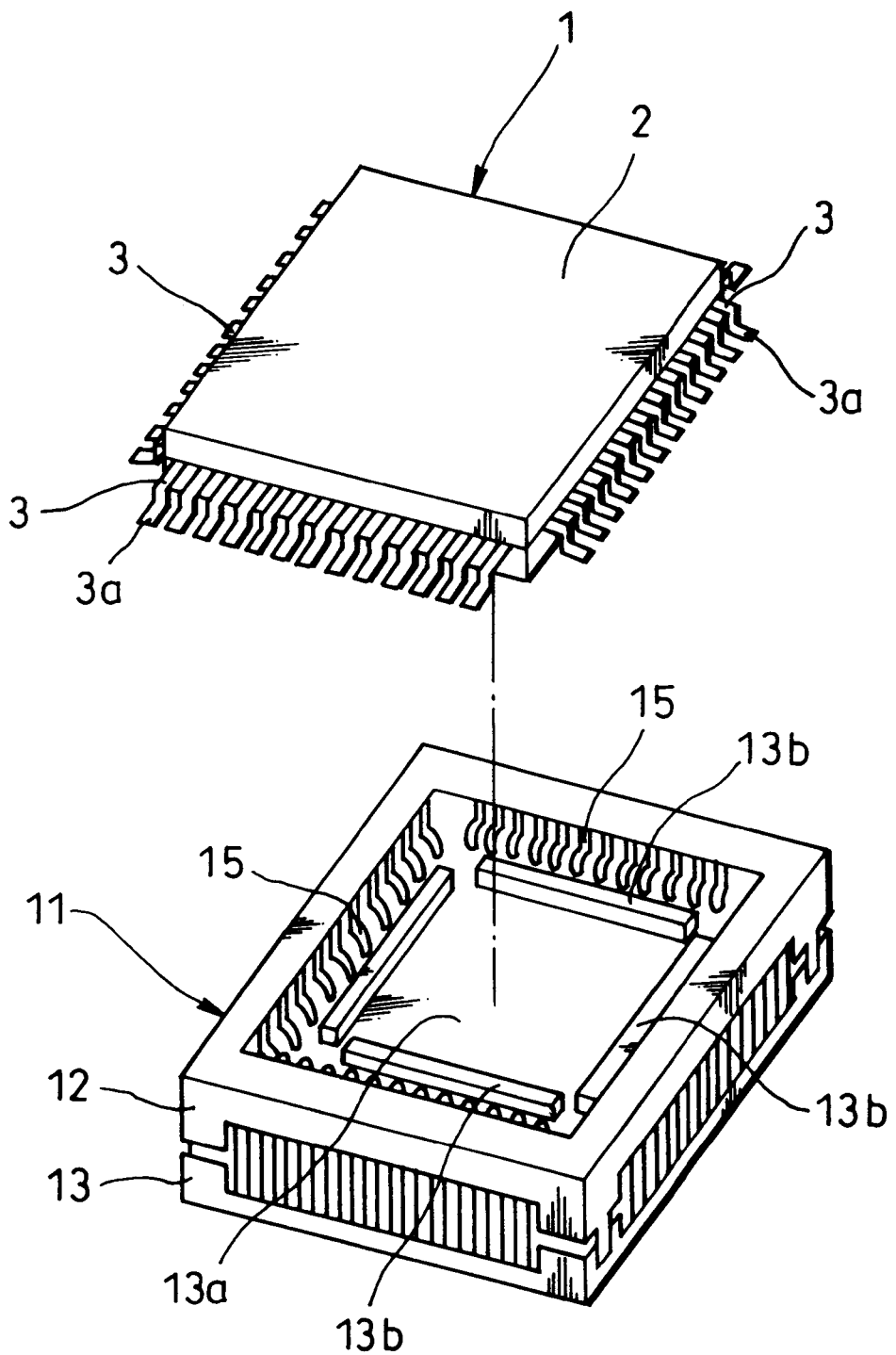
FIG. 1 is a perspective view showing a socket and a semiconductor device mounted thereto.
Figure 2:
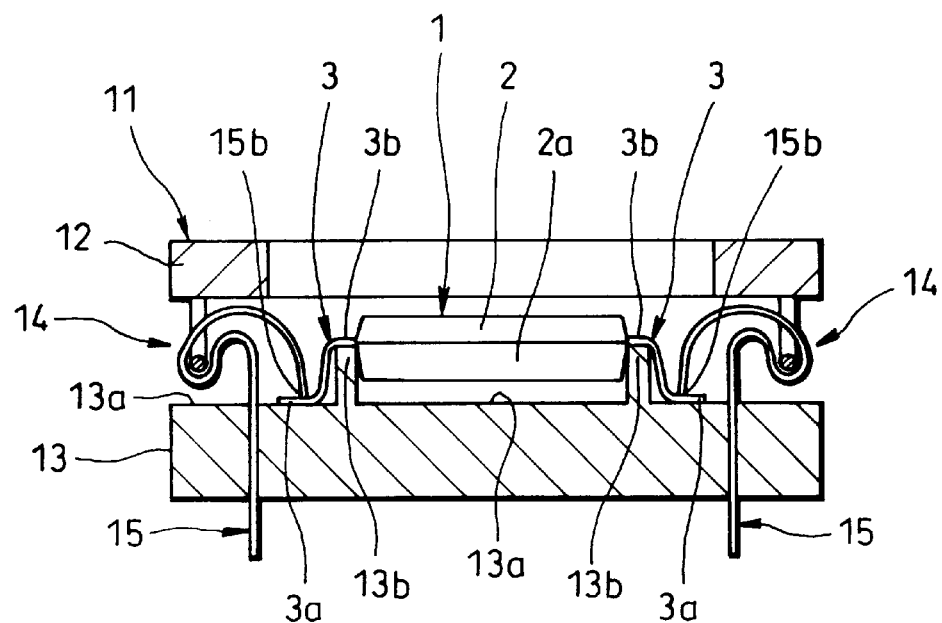
FIG. 2 is a vertical section view showing the socket illustrated in FIG. 1 in a condition that the semiconductor device shown in FIG. 1 is mounted thereto.

In FIGS. 1 and 2, reference numeral 1 denotes a QFP-type semiconductor device having a gull-wing type lead terminals. This semiconductor device 1 includes a body 2 thereof having a top wall and front, rear, left and right side walls formed integrally therewith. A plurality of crank-type leads 3 extend laterally from vertically central portions of the side walls of the semiconductor device body 2. The body 2 is formed, as a whole, into a box shape, and the top wall has a rectangular planar shape.

Reference numeral 11 denotes a socket for receiving the semiconductor device 1. The socket 11 comprises a socket body 13, contact pins 15 respectively extending through the socket body 13 in the thickness direction at outer peripheral edge portions of the socket body 13, and a lid member 12 disposed to face the socket body 13 and to be movable vertically of the socket.

As shown in FIG. 2, the socket body 13 is formed, as a whole, into a thick plate-like shape, and has a rectangular planar shape. The lid member 12 is formed into a plate shape and is substantially the same in planar shape as the socket body 13. The lid member 12 is formed at its central part with a rectangular aperture extending thicknesswise and permitting the semiconductor device 1 to pass therethrough. That is, the socket 11 is of an open top type.

As shown in FIGS. 1 and 2, four positioning portions 13b are formed integrally with the socket body 13 and project from an upper face 13a of the socket body. These positioning portions 13b extend perpendicular to one another on the upper face 13a of the socket body, and define, as a whole, a space for receiving a lower part of the semiconductor device body 2. This space is provided between the socket body 13 and the lid member 12 and defines a lower part of an accommodation space for receiving the semiconductor device body 2.

In FIG. 2, reference numeral 14 denotes an engagement member comprised of a small-diameter rod. A primary part of the engagement member 14 extends along an outer peripheral edge of the lid member 12, and forms a rectangular planar shape, as a whole. The engagement member 14 has coupling portions thereof extending between four corners of the rectangular primary portion and a lower face of the lid member 12.

As shown in transverse section in FIG. 2, each of the contact pins 15 has a lid-member side end portion thereof which is bent substantially in an S-shape while extending laterally outwardly of the socket body and is further bent in a semi-circular shape while extending laterally inwardly of the socket body. The contact pins 15 are in engagement at their S-shape portions with the engagement member 14. Respective other ends, not shown, of the contact pins 15 are connected to a printed circuit board (not shown) of the testing apparatus.

Figure 6:
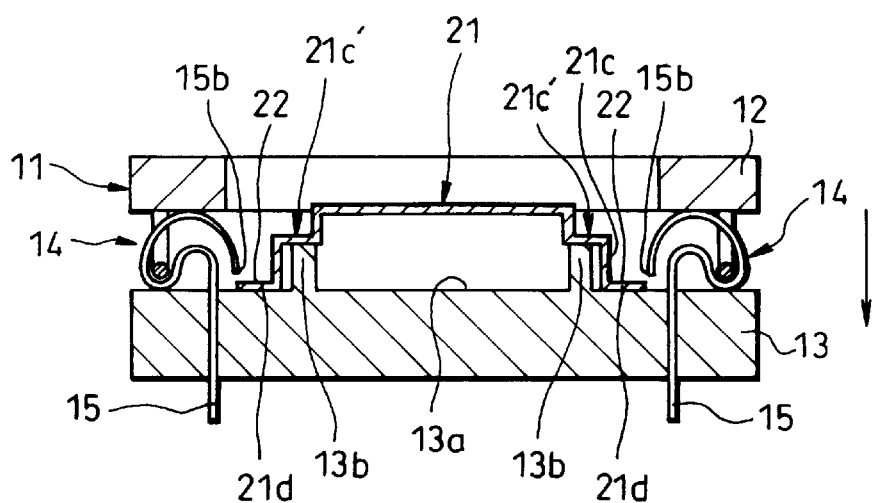
FIG. 6 is a vertical section view showing the polishing chip, shown in FIG. 3 and adapted to be mounted to the socket shown in FIGS. 1 and 2, in a condition that the contact pins of the socket are separated from the extension.

Upon start of evaluation testing of the semiconductor device 1, the lid member 12 of the socket 11 is depressed downward toward the socket body 12. As understood from FIG. 6 showing part of process of mounting the polishing chip to the socket 11, when the lid member 12 is depressed, the S-shape portions of the contact pins are urged downward by the engagement member 14 formed integrally with the lid member 12, so that outer ends of the semi-circular portions of the contact pins 15, i.e., the distal ends of the contact pins are moved toward their receding positions (corresponding to FIG. 6) located obliquely above their connecting positions (corresponding to FIG. 7). Whereupon the semiconductor device 1 is inserted into the socket body 13 through the central rectangular aperture of the lid member 12, to thereby mount the semiconductor device body 2 in the accommodation space of the socket body 13. In this state, the leads 3 of the semiconductor device 1 extend along outer faces of the positioning portions 13b of the socket body 13 and along the upper face 13a of the socket body.

Thereafter, the depression of the lid member 12 is released, and hence the distal ends of the contact pins 15 move obliquely downward from the receding positions while lifting the lid member 12 up by means of spring forces of the contact pins 15. The distal end faces of the contact pins 15 slidingly move along the surfaces of the distal end portions (connecting portions) 3a of the leads to reach their connecting positions, whereby the semiconductor device 1 is connected with the socket 11. Under this state, testing is made on the semiconductor device 1. After completion of the evaluation testing, the lid member 12 is depressed to move the contact pins 15 toward their receding positions, and then the semiconductor device 1 is detached from the socket 11. By repeating the aforesaid procedure, evaluation testing will be carried out in respect of a number of semiconductor devices.

As already explained, during the evaluation testing, foreign substances such as solder transferred from the leads of semiconductor devices to the contact pins of the socket are adhered to the contact pins.

With reference to FIGS. 3–11, a polishing chip, according to a first embodiment of the present invention, used to remove foreign substances from the contact pins will be explained.

The polishing chip is mounted to the socket 11 instead of the semiconductor device 1 upon removal of foreign substances from the contact pins 15 of the socket 11 shown in FIGS. 1 and 2.

Figure 3:
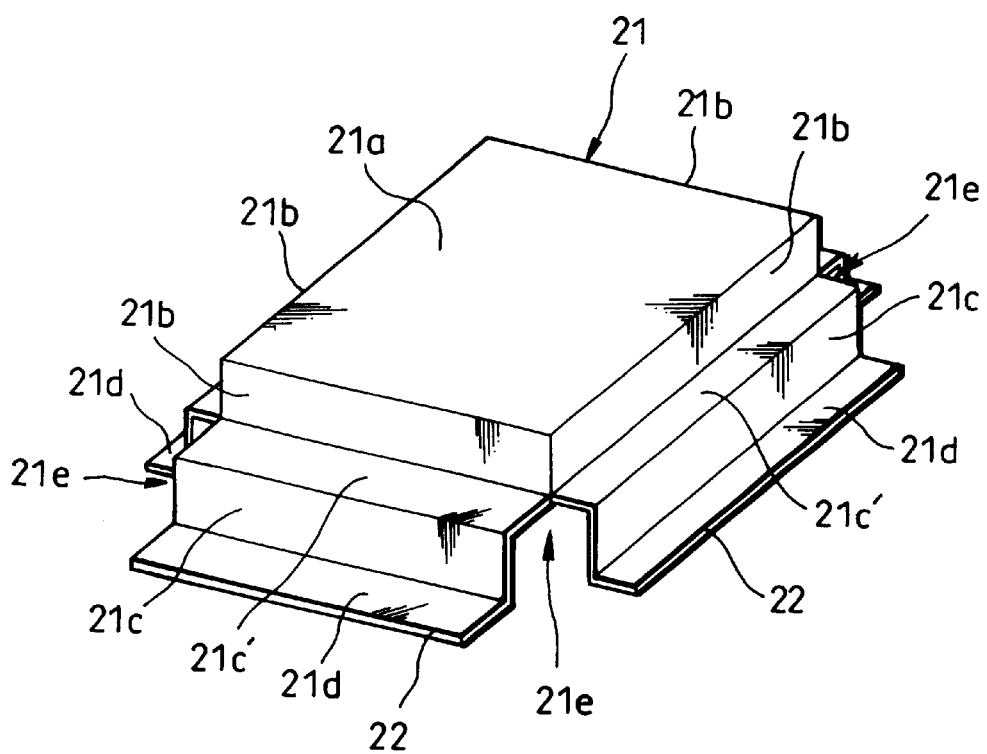
FIG. 3 is a perspective view of a polishing chip according to a first embodiment of the present invention and used for removal of foreign substances from contact pins of the socket shown in FIGS. 1 and 2.
Figure 4:
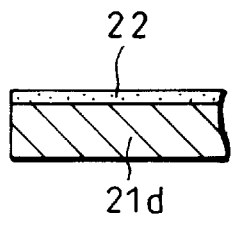
FIG. 4 is a fragmentary vertical section view of the polishing chip shown in FIG. 3, in which an abrasive layer is formed on an upper face of a distal end portion of an extension of the polishing chip.

As shown in FIGS. 6 an 7, the polishing chip 21 of this embodiment is arranged to be mounted to the semiconductor-device receiving section of the socket 11. As shown in FIG. 3, the polishing chip 21 comprises a polishing chip body corresponding to the semiconductor device body 2, and four extensions corresponding, as a whole, to a plurality of leads 3 of the semiconductor device 1. The polishing chip 21 is fabricated by forming a sheeting having an abrasive layer (shown by reference numeral 22 in FIG. 4). The polishing chip body is formed integrally with the four extensions.

The polishing chip body has its top wall 21a having a rectangular planar shape thereof substantially the same as that of the top wall of the semiconductor device body 2, and front, rear, left, and right side walls 21b formed integrally with the top wall 21a. As understood from comparison between FIGS. 2 and 7, the side walls 21b of the polishing chip body extend vertically of the polishing chip for a length substantially equal to the height of a top-wall-side half of the semiconductor device body 2. Thus, the polishing chip body has its outer shape substantially the same as that of the top-wall-side half of the semiconductor device body 2.

Each polishing chip extension is formed into a crank-shape. The outer shape of the extension is substantially the same as that of the entirety of a group of leads 3 extending from a corresponding one of the side walls of the semiconductor device body 2. A notch 21a is formed between adjacent extensions.

Figure 7:
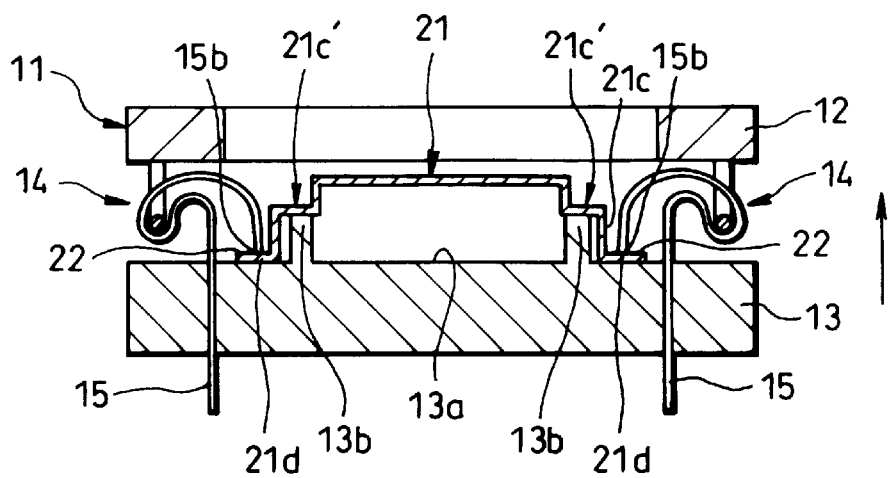
FIG. 7 is a vertical section view showing the polishing chip mounted to the socket in a state where the contact pins are in contact with outer edge portions of the extensions.
Figure 8:
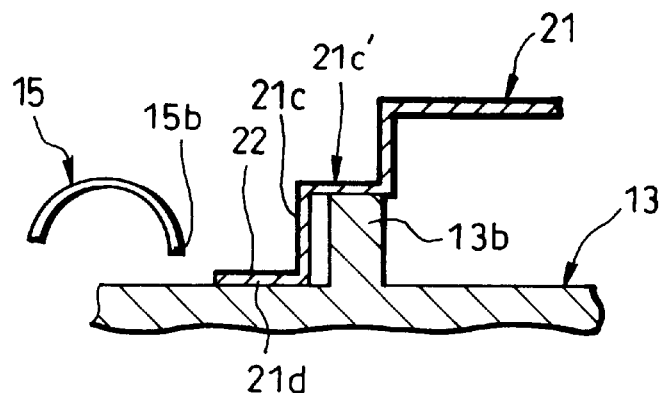
FIG. 8 is a fragmentary enlarged vertical section view showing, in an enlarged scale, the state shown in FIG. 6 where the contact pins are separated from the extensions.

Each polishing chip extension includes a first horizontal portion 21c' thereof extending laterally outwardly from a lower edge of the side wall 21b of the polishing chip body, a vertical portion 21c thereof extending vertically downwardly from an outer edge of the first horizontal portion 21c', and a second horizontal portion 21d thereof extending laterally outwardly from a lower edge of the vertical portion 21c. The second horizontal portion 21d has its length which is substantially the same as that of the distal end portions 3a (FIG. 1) of the leads of the semiconductor device 1. As shown in FIGS. 6 and 7, the depth of the first horizontal portion 21c' is slightly larger than the width of an associated positioning portion 13b of the socket 11. The height of the vertical portion 21c is the same as that of the positioning portion 13b.

As mentioned above, the outer shape of the polishing chip body is substantially the same as that of the top-wall-side half of the semiconductor device body 2, and the outer shape of the polishing chip extension is substantially the same as that of a group of leads 3 of the semiconductor device. Thus, the polishing chip is, as a whole, substantially the same in outer shape as the semiconductor device 1. Further, the polishing chip fabricated by forming a sheeting has an internal space thereof substantially the same in shape as the consolidation of the positioning portions 13b of the socket body 13 and the semiconductor device 1 partly received in the positioning portions 13b. Accordingly, as shown in FIGS. 6 and 7, by putting the polishing chip on the upper face 13a of the socket body such as to cover the positioning portions 13b, the polishing chip can be properly mounted to the semiconductor-device mounting section of the socket 11. At this time, the polishing chip formed with the notches 21a does not interfere with support members (not shown) formed at four corners of the socket 11.

In the following, a method of fabricating the polishing chip 21 will be explained.

First, a sheeting made of polyester, PCV, paper, metal sheet (preferably, SUS whose surface withstands oxidization) or the like is prepared. The sheeting has flexibility and a thickness of several tens micrometers to 100 micrometers (for instance, about 100 micrometers). Next, an abrasive is applied, by coating, to a face (upper face) of at least those parts of the sheeting which correspond to at least the distal end portions 3a of the leads of the semiconductor device, in thickness of several micrometers to several tens micrometers (for instance, about 30 micrometers). The abrasive is comprised of almina, iron oxide, silicon nitride, artificial diamond, ceramic, chrome, or the like. Whereupon, in a state that the abrasive-coated face is directed upward, the sheeting is subject to press-forming to thereby obtain the polishing chip 21 formed into a shape shown in FIG. 3. In the polishing chip 21, an abrasive layer 22 is formed on the upper face of at least the second horizontal portions 21d of the polishing chip extension.

Figure 5:
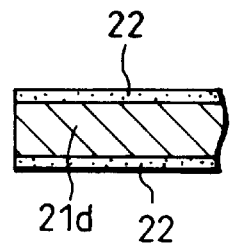
FIG. 5 is a fragmentary vertical section view of the polishing chip having the extension thereof formed at upper and lower faces with the abrasive layer.

In the fabrication of the polishing chip 21 of the present embodiment, the sheeting having one surface (upper face) thereof formed with the abrasive layer 22 is used. Alternatively, a sheeting having both the upper and lower faces thereof formed with the abrasive layer 22, as shown in FIG. 5, may be employed. According to a polishing chip fabricated from the sheeting having the upper and lower faces coated with the abrasive layer 22, the abrasive layer 22 is provided at both the upper and lower faces of at least the distal end portions 21d of the polishing chip extensions. As mentioned later, the polishing chip of this kind can be employed for removal of foreign substances from the contact pins of sockets of various kinds.

Preferably, the distal end portions 21d of the polishing chip have their thickness substantially the same as that of the distal end portions 3a of the leads of the semiconductor device 1. Accordingly, in the case of forming the abrasive layer at both the faces of the sheeting, the thickness of the sheeting or the abrasive layer must be decreased. If the sheeting is thinned, the mechanical strength of the sheeting is lowered. Thus, it is advisable to use the abrasive that is small in particle size (for instance, in the order of 150 micrometers), thereby reducing the thickness of the abrasive layer.

Next, explanations will be given as to removal of foreign substances from the contact pins of the socket 11 in term of polishing achieved with use of the polishing chip 21.

Figure 9:
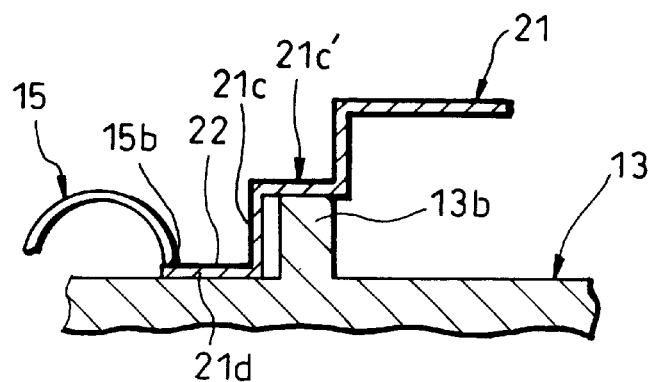
FIG. 9 is a fragmentary enlarged vertical section view showing the state where the contact pins are in contact with the outer edge portions of the extensions.
Figure 10:
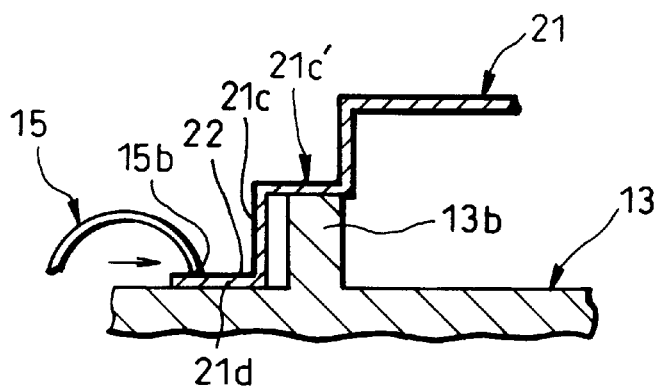
FIG. 10 is a fragmentary enlarged vertical section view for explaining a sliding motion of the contact pins along a surface of the extension.
Figure 11:
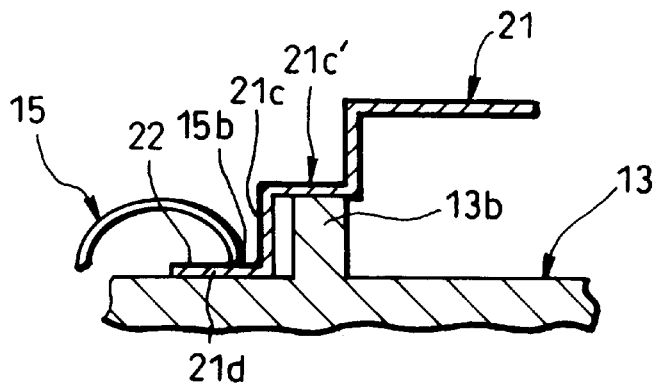
FIG. 11 is a fragmentary vertical section view showing, in an enlarged scale, the state shown in FIG. 7 where the contact pins are in contact with the outer edge portions of the extensions.

After the semiconductor device 1 is dismounted from the socket 11, the lid member 12 of the socket 11 is depressed, thereby causing the distal ends 15b of the contact pins 15 of the socket 11 to move obliquely upward to their receding positions from the upper face 13a of the socket body. Next, the polishing chip 21 is mounted to the socket body 13 such that the positioning portions 13b formed on the upper face 13a of the socket body are covered by the polishing chip 21. Subsequently, the depression of the lid member 12 is released to move the lid member 12 upward, causing the distal end faces 15b of the contact pins 15 to contact with the abrasive layer 22 of the distal end portions 21d of the polishing chip 21, as shown in FIG. 9. A further slight upward movement of the lid member 12 causes the tip end faces 15b of the contact pins 15 to slide laterally toward the vertical portion 21 of the polishing chip extension, as shown by an arrow in FIG. 10, while being in contact with the abrasive layer 22. Upon completion of the upward movement of the lid member 12, the sliding motion of the contact pins 15 is completed as shown in FIGS. 7 and 11. By the above-mentioned sliding motion of the contact pins 15, foreign substances such as solder or oxide film adhered to the tip end faces of the contact pins 15 are removed. In order to reliably remove foreign substances from the tip end faces 15b of the contact pins 15, the sliding motion of the contact pins 15 is repeated, e.g., four to five times, in term of depression and release of depression of the lid member 12 of the socket 11. After completion of the removal of foreign substances, the lid member 12 is depressed to cause the contact pins 15 to recede, and the polishing chip 21 is taken out. Preferably, the used polishing chip 21, to which solder or oxide film components are transited from the contact portions 15b of the contact pins 15, is thrown away after one use.

Usage of the polishing chip 21 having its outer shape substantially the same as that of the semiconductor device 1 makes it possible to improve the efficiency in foreign substance removing process implemented by using an automatic mounter of the testing apparatus, without the need of adjusting an ordinary stroke of the mounter, which is ordinarily utilized for mounting the semiconductor devices 1 to the socket 11.

The positioning portions formed in the upper face 13a of the socket body is not limited to the arrangement shown in FIG. 1 where the four positioning portions 13b are arranged in a manner that their adjacent ends are separated from one another. For instance, the four positioning portions may be formed integrally in a rectangular frame shape. Moreover, it is not inevitably necessary to form the positioning portions into a plate shape which is rectangular in cross section. The positioning portions may be configured by a plurality of projections formed at appropriate locations on the upper face 13a of the socket body (for instance, at four corners of the socket body, or at four corners and intermediate locations therebetween). The polishing chip 21 is applicable not only to sockets having positioning portions of any one of aforementioned types but also to sockets having no positioning portions.

In the above, the socket 11 of a type having the contact pins 15 whose distal ends 15b are brought in contact with the distal end portion 3a of the leads has been explained. However, in order to avoid damages of distal end portions of the leads during the evaluation testing of the semiconductor device 1, the socket may be of a different type arranged to cause the distal ends 15b of the contact pins 15 to contact with shoulder portions 3b of the leads. Upon removal of foreign substances from the socket of this kind, the tip ends 15b of the contact pins 15 are brought in contact with the first horizontal portions 21c' (FIG. 3) of the polishing chip 21. At this time, these polishing chip portions 21c' to which contact pressures are applied are prevented from being flexed since they are supported by the positioning portions 13b. This makes it possible to reliably polish the tip ends 15b of the contact pins, so that the removal of foreign substances may be made with reliability.

In the following, a polishing chip according to a second embodiment of this invention will be explained.

Figure 12:
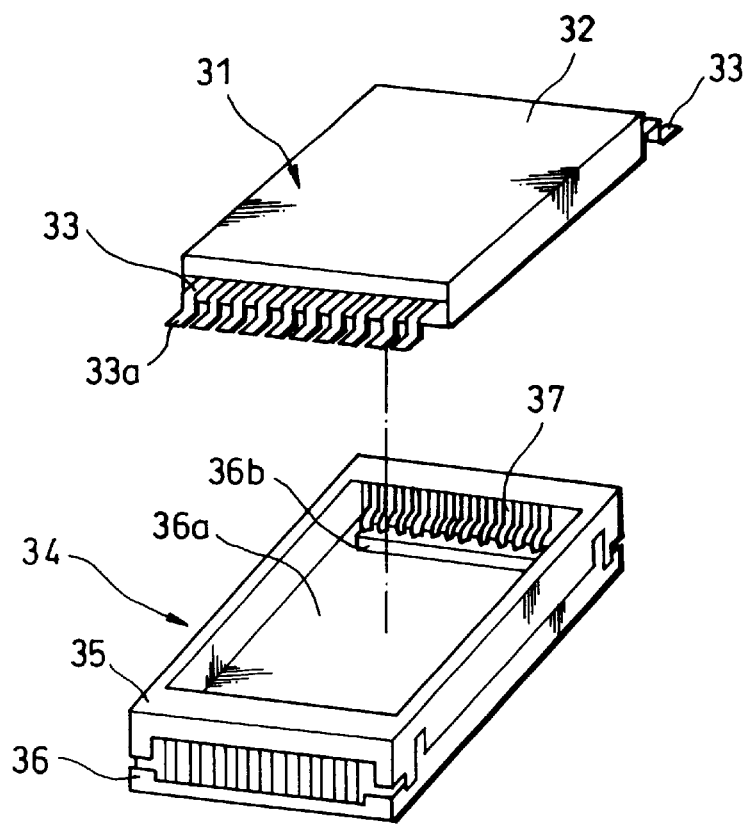
FIG. 12 is a perspective view showing a socket of a type different from the socket show in FIG. 1, and a semiconductor device, mounted thereto, of a type different from the semiconductor device shown in FIG. 1.

A socket to which the polishing chip of this embodiment is applied is configured to be mounted with semiconductor devices of an SOP (Small Out-line Package) type or a TSOP (Thin SOP) type. As shown in FIG. 12, the semiconductor device 31 of this kind has a body 32 thereof, and a plurality of crank-type leads 33 thereof extending outwardly from vertically central portions of two opposite side walls of the semiconductor device body 32. That is, the semiconductor device 31 has two groups of leads. The socket 41, which is configured in substantially the same manner as with the socket 11 of the first embodiment, is comprised of a lid member 35, a socket body 36, contact pins 37, and achieves a function similar to that of the socket 11. Two positioning portions 36b are provided on the upper face 36b of the socket body integrally therewith and extending along the two groups of contact pins 37. When the semiconductor device 31 is mounted to the socket body 36, each of the positioning portions 36b is located between proximal end portions and tip-end-side connecting portions 33a of a corresponding group of leads 33 of the semiconductor device 31 and is in contact with a lower part of a corresponding one of the opposite side faces of the semiconductor device body 32, whereby the semiconductor device 31 is positioned in place.

Figure 13:
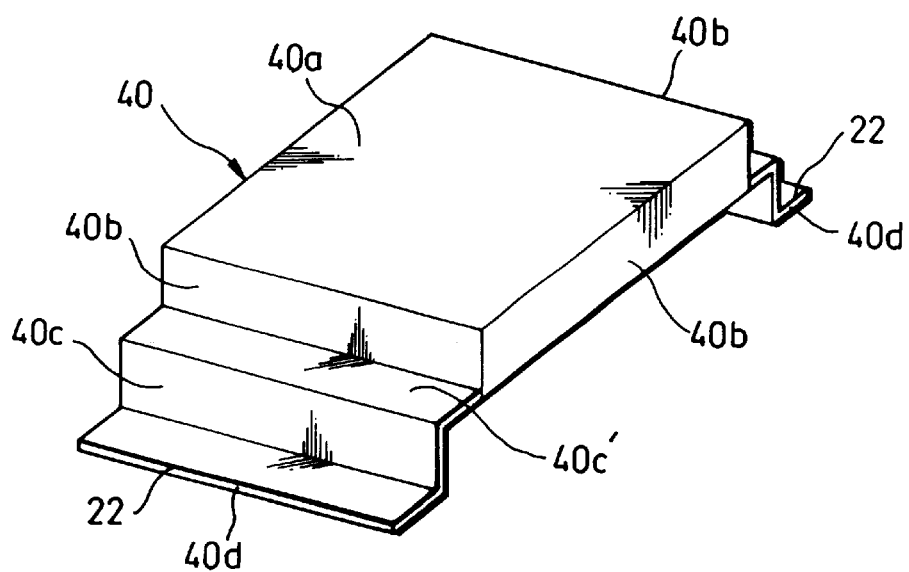
FIG. 13 is a perspective view of a polishing chip according to a second embodiment of the present invention which is applied to the socket shown in FIG. 12.

Referring to FIG. 13, the polishing chip 40, which is applied to the polishing of the contact pins 36 of the socket 35 shown in FIG. 12, has its outer shape substantially the same as that of the semiconductor device 31, as in the case of the first embodiment. That is, the polishing chip 30 comprises a body thereof formed into a box shape which is substantially the same in outer shape as an upper half of the semiconductor device body 32. The polishing chip body is comprised of a top wall 40a, and front, rear, left, and right side walls, i.e., four side walls 40b. The polishing chip 40 comprises two extensions 40c respectively corresponding to two groups of leads 33 of the semiconductor device 31. Each extension 40 c is formed into a crank-type outer shape which is the same as the outer shape of the entirety of a corresponding one lead group. As in the case of the polishing chip 20 of the first embodiment, the polishing chip 40 is fabricated by press-machining a sheeting having an abrasive layer 22 formed by applying an abrasive thereto. The polishing chip 40 is employed in the same manner as with the polishing chip 20, thereby polishing the distal end portions of the contact pins 37 of the socket 34 so as to remove foreign substances adhered thereto.

The polishing chip 40 may be formed with abrasive layers at upper and lower faces of the polishing chip extensions, as in the case of the polishing chip 20 of the first embodiment. The polishing chip 40 may be applied to a socket having no positioning portions on an upper face 36a of a socket body. Moreover, abrasive layers may be formed at shoulder portions 40c' of the polishing chip 40.

In the following, a polishing chip according to a third embodiment of the present invention will be explained.

This polishing chip is used to remove foreign substances from a socket adapted for a final test in a testing apparatus for evaluation of semiconductor devices.

Figure 14:
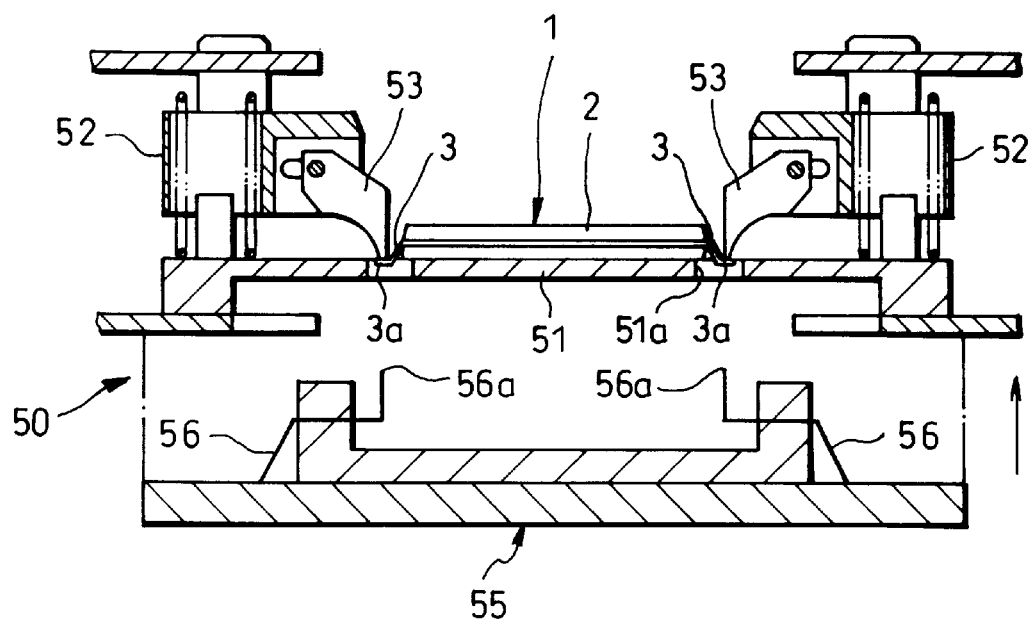
FIG. 14 is a vertical section view showing a probe socket used for a final test of semiconductor devices and the semiconductor device mounted to a transfer board forming part of the probe socket in a condition that contact pins of the probe socket are separated from leads of the semiconductor device.

As shown in FIG. 14, a semiconductor-device mounting section of a socket installed in a testing apparatus 50 comprises a direct-transfer board 51 on which the body 2 of a semiconductor device 1 is placed, a carrier 52 having lead pressers 53 for depressing upper faces of distal connecting portions 3a of the leads 3 of the semiconductor device, and a probe-socket section 55 disposed to be movable relative to the transfer board 51 vertically of the socket. In the final test of the semiconductor device 1, the probe socket section 55 is moved upward, as shown by arrow in FIG. 14, toward the transfer board 51 on which the semiconductor device 1 is placed, so that the distal connecting portions 56a of the contact pins 56 of the probe socket section 55 pass through slots 51a formed in the transfer board 51 to extend thicknesswise therethrough. Whereupon, the contact portions 56a of the contact pins 56 are brought in contact with the lower faces of the connecting portions 3a of the leads 3 of the semiconductor device 1, thereby connecting the probe socket section 55 with the semiconductor device 1.

Figure 16:
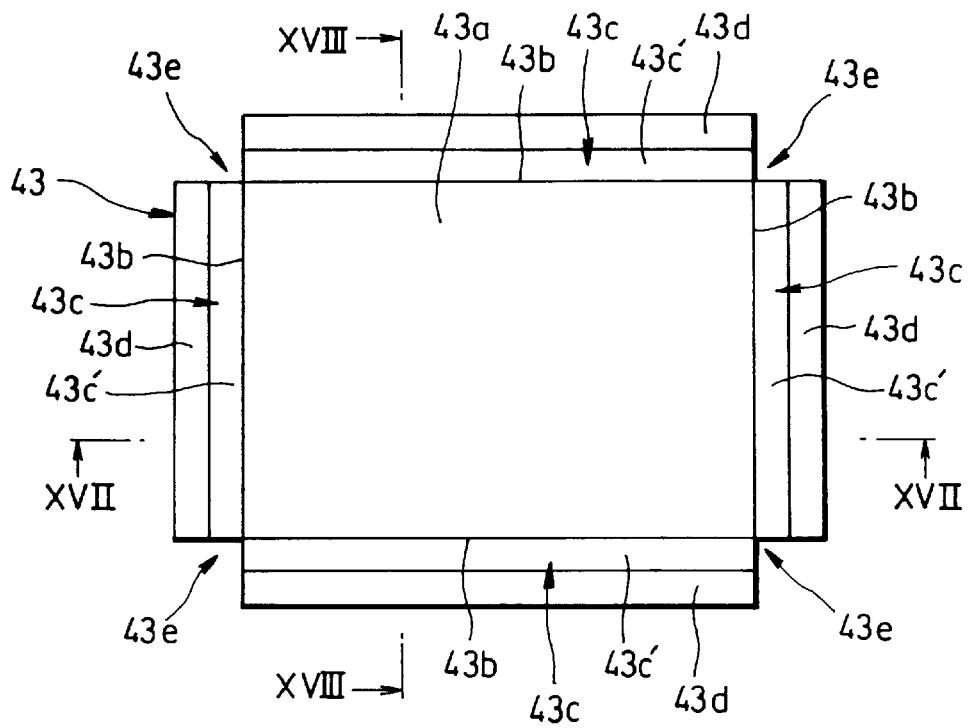
FIG. 16 is a plan view of a polishing chip according to a third embodiment of the present invention.
Figure 17:
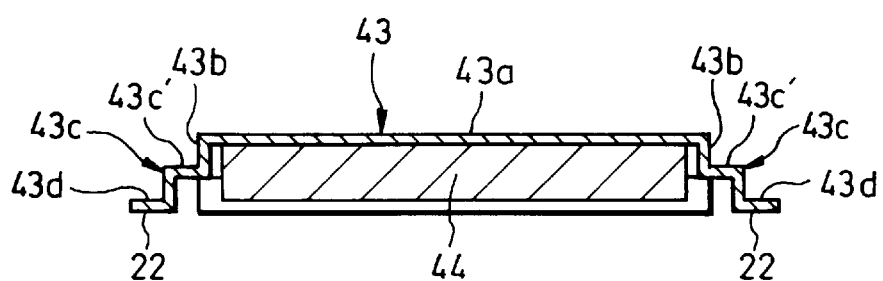
FIG. 17 is a sectional view of the polishing chip taken along line XVII—XVII in FIG. 16.
Figure 18:
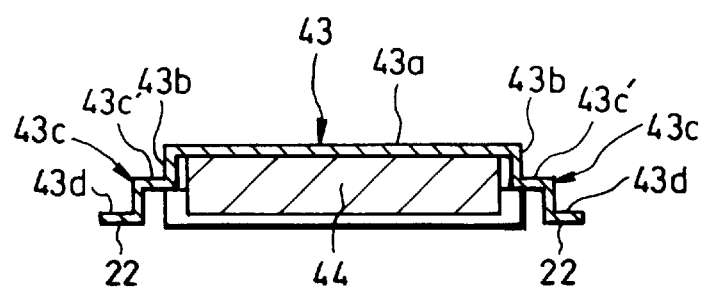
FIG. 18 is a sectional view of the polishing chip taken along line XVIII—XVIII in FIG. 16.

As shown in FIGS. 16–18, the polishing chip 43 of this embodiment is configured basically the same as the polishing chip 21 of the first embodiment. That is, the polishing chip 43, which is fabricated by forming a sheeting on which an abrasive layer is formed, comprises a body consisting of a top wall 43a and front, rear, left, and right side walls 43b, and four extensions integrally formed with the polishing chip body. The polishing chip body is formed, as a whole, into a box-shape which is substantially the same in outer shape as an upper half of the semiconductor device body 2. Each of the polishing chip extensions includes a horizontal portion (shoulder portion) 43c', a vertical portion 43c, and a horizontal distal end portion 43d. Each extension is formed, as a whole, into a crank-shape corresponding to the outer shape of the entirety of an associated one group of leads 3 of the semiconductor device 1. The abrasive layer 22 is formed in the lower face of the distal end portion 43d of the polishing chip extension, in such a manner that the contact portions 56a of the contact pins 56 of the probe socket 55 are disposed for contact with the abrasive layer 22. Reference numeral 43e denotes a notch.

Unlike the polishing chip of the first embodiment, a solid portion 44 obtained by forming resin material is affixed to a lower face of the top wall 21a of the body of the polishing chip 40 of the present embodiment. The length measured vertically from the upper face of the top wall 21a of the polishing chip body to a bottom face of the solid portion 44 is nearly equal to the height of the semiconductor device body 2.

The abrasive layer 22 may be formed in both the upper and lower faces of the shoulder portions 43c' of the polishing chip 43. In this case, the formation of the abrasive layer 22 in the upper and lower faces of the shoulder portion 43c' can be easily made by forming the polishing chip from a sheeting having upper and lower faces thereof formed with an abrasive layer.

Figure 19:
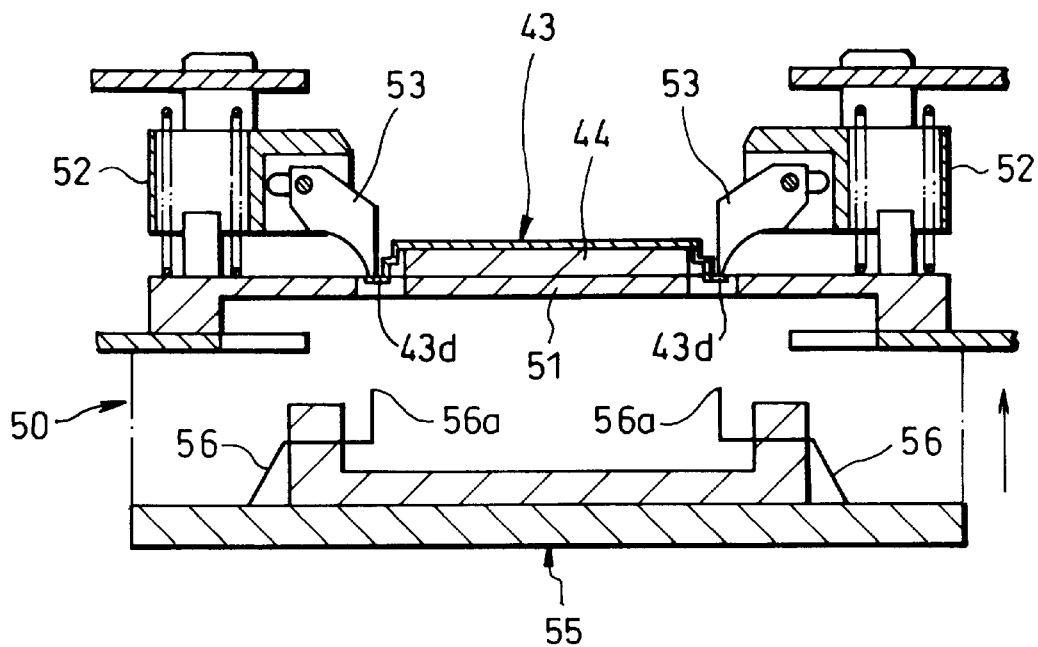
FIG. 19 is a vertical section view showing the polishing chip shown in FIG. 16 in a state where it is placed on the transfer board of the probe socket shown in FIGS. 14 and 15.
Figure 20:
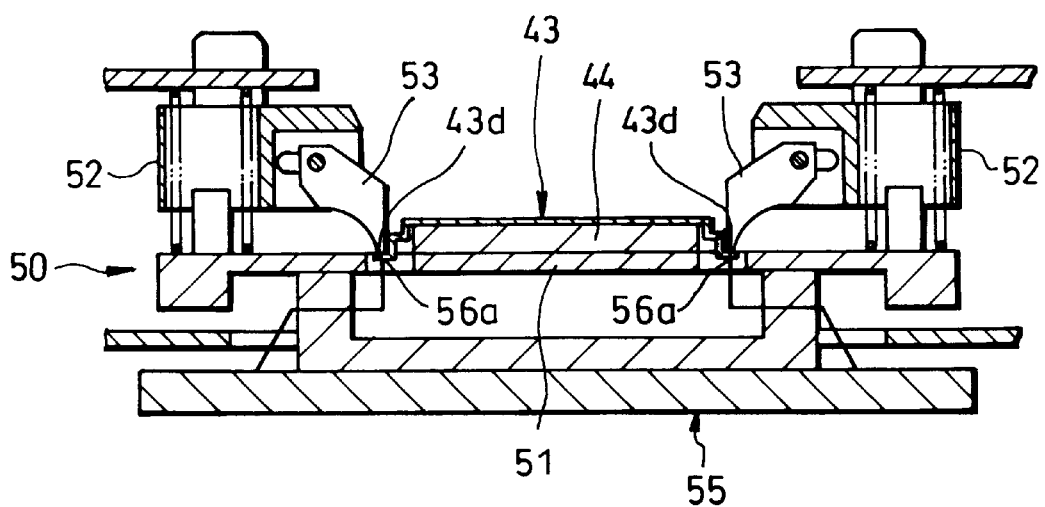
FIG. 20 is a vertical section view showing the polishing chip shown in FIG. 16 in a condition that the contact pins of the probe socket are in contact with the extensions of the socket.

As shown in FIG. 19, the polishing chip 43 of the present embodiment is placed on the direct-transfer board 51 in a manner that the solid portion 44 of the polishing chip abuts against the transfer board, and the distal end portions 43d of the polishing chip extensions are held by the lead pressers 53. By moving the probe socket 55 upward toward the polishing chip 43, the distal end portions 56a of the contact pins 56 of the probe socket 55 are brought in contact with the abrasive layer 22 formed in the lower faces of the distal end portions 43d of the polishing chip extensions, as shown in FIG. 20. Thereafter, when the probe socket 55 is further moved slightly upward, the contact pins 56, having a flexibility, slide on the surface of the abrasive layer 22. Due to this sliding movement, the distal end portions 56a of the contact pins 56 are polished by the abrasive layer 22, so that foreign substances adhered thereto are removed.

By modifying the polishing chip 43 of this embodiment based on the polishing chip 40 of the second embodiment, it is possible to configure a polishing chip adapted for removal of foreign substances from a socket used to carry out a final test of semiconductor devices of an SOP type or a TSOP type.

In the following a polishing chip according to a fourth embodiment of the present invention will be explained.

As in the case of the polishing chip of the third embodiment, the polishing chip of this embodiment is suited to remove foreign substances from a socket used for a final test. Unlike the polishing chip of the third embodiment in which the solid portion for the placement of the polishing chip on the transfer board is formed in the lower face of the top wall of the polishing chip body, the polishing chip 47 of the present embodiment is configured to be placed on the transfer board, with proximal end portions of the polishing chip extensions made in contact with the transfer board.

Figure 21:
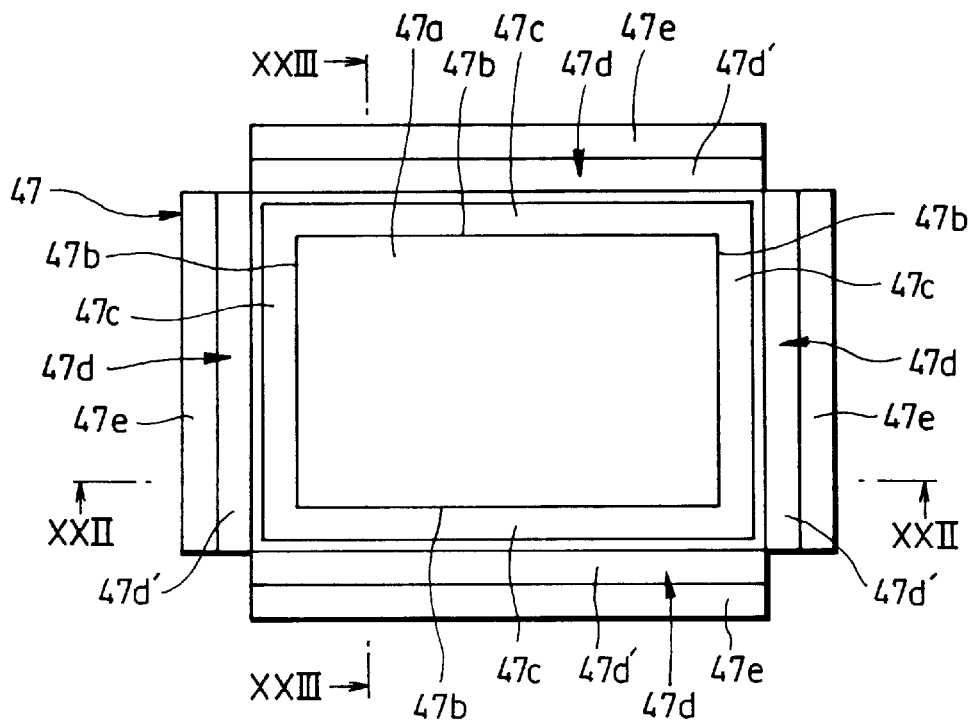
FIG. 21 is a plan view of a polishing chip according to a fourth embodiment of the present invention.
Figure 22:
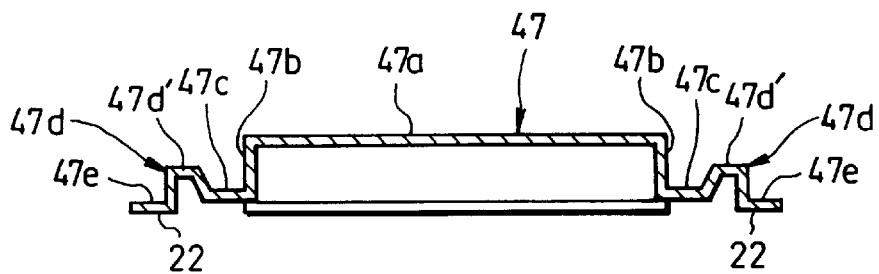
FIG. 22 is a sectional view of the polishing chip taken along line XXII—XXII in FIG. 21.
Figure 23:
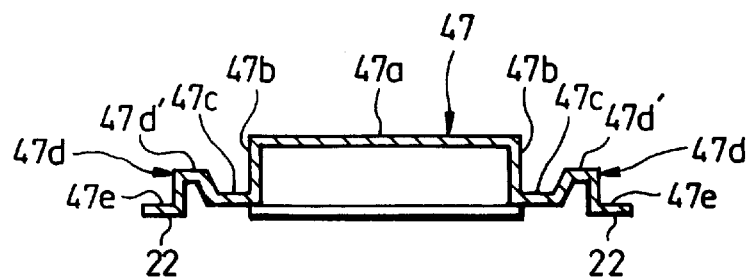
FIG. 23 is a sectional view of the polishing chip taken along line XXIII—XXIII in FIG. 21.

As shown in FIGS. 21–23, the polishing chip 47 of the present embodiment comprises a body having an outer shape thereof substantially the same as that of the semiconductor device body 2 shown in FIG. 1. The polishing chip body consists of a top wall 47a and front, rear, left, and right side walls, i.e., four side walls 47a. The polishing chip body has its height substantially the same as the that of the semiconductor device body 2. The polishing chip is fabricated by forming a sheeting, and includes four polishing chip extensions formed integrally with the polishing chip body. Each of the polishing chip extensions consists of a first horizontal portion 47c thereof extending laterally outwardly from a lower edge of the side wall 47d of the polishing chip body, a projecting strip portion 47d thereof formed into an inverted U-shape in transverse cross section, and a second horizontal portion 47ae thereof having a lower face formed with an abrasive layer 22. The provision of the projecting strip portion 47d in the polishing chip extension makes it possible to increase the strength of the extension. The projecting strip portion 47d consists of a slant portion thereof extending obliquely upwardly outwardly from an outer edge of the first horizontal portion 47c, a horizontal portion thereof extending laterally outwardly from an outer edge of the slant portion, and a vertical portion thereof extending vertically downwardly from an outer edge of the just-mentioned horizontal portion.

The removal of foreign substances from the contact pins 56 of the prove socket 55 with use of the polishing chip 47 of the present embodiment is carried out, as in the case of the third embodiment (FIGS. 19 and 20), in a condition that the polishing chip 47 is placed on the transfer board of the testing apparatus in such a manner that the distal contact portions 56a of the contact pins 56 of the probe socket 55 are disposed for contact with the abrasive layer 22 of the polishing chip extensions. In this embodiment, the proximal end portions 47c of the extensions of the polishing chip 47 are abutted against the transfer board 51, unlike the third embodiment where the solid portion 44 of the polishing chip is abutted against the transfer board 51 for the placement of the polishing chip on the transfer board 51. Since the present embodiment is the same as the third embodiment in other respects, explanations on the procedure for removal of foreign substances from the contact pins 56 with use of the polishing chip 47 are omitted.

The polishing chip 47 of this embodiment can be modified as in the case of the third embodiment. For instance, the abrasive layer 22 may be formed on the upper face 47d' of the projecting strip portion 47d of the polishing chip 47. In this case, it is advisable to form the abrasive layer 22 on both side faces of a sheeting from which the polishing chip 47 is fabricated. Further, by modifying the polishing chip 47, a polishing chip can be provided which is suitable for removal of foreign substances from a socket used for a final test of semiconductor devices of an SOP type or a TSOP type.

In the following, a polishing chip according to a fifth embodiment of the present invention will be explained.

This polishing chip is used to remove foreign substances from a socket to which semiconductor devices of a CSP/BGA (CSP Ball Grid Array) type are mounted. The semiconductor device of this kind has a plurality of ball-type grids (semi-spherical lead electrodes), i.e., a plurality of leads, formed in a grid array fashion on a lower face of the body of the semiconductor device. The socket to which such a semiconductor device is mounted is provided with a plurality of contact pins arranged in a grid array.

Figure 24:
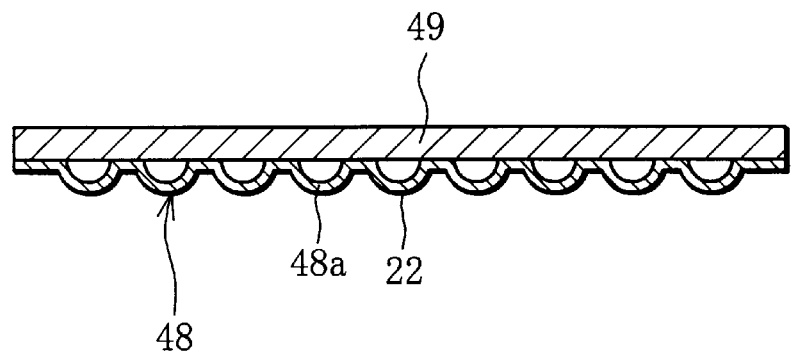
FIG. 24 is a sectional view of a polishing chip according to a fifth embodiment of the present invention.

As shown in FIG. 24, the polishing chip of this embodiment comprises a plate-like polishing chip body 49 obtained by forming resin material into a shape which is substantially the same as the outer shape of the semiconductor device body, and an extension 48 affixed to a lower face of the polishing chip body 49. The polishing chip extension 48 is fabricated by forming a sheeting having one side face (lower face) thereof formed with the abrasive layer 22. The polishing chip extension 48 is formed at its lower face with a plurality of semi-spherical polishing portions 48 each of which is in turn formed at its lower face with the abrasive layer 22. As viewed in transverse cross section perpendicular to the transverse cross section shown in FIG. 24, the polishing chip has its sectional shape which is substantially the same as the transverse sectional shape shown in FIG. 24. That is, the semi-spherical polishing portions 48a of the polishing chip are arranged in a grid array as with the semi-spherical lead electrodes of the semiconductor device. The polishing portions 48a are, as a whole, substantially the same in outer shape as the entirety of the semi-spherical lead electrodes of the semiconductor device.

Upon removal of foreign substances from the socket adapted for semiconductor devices of a CSP/BGA type, the polishing chip is mounted to the semiconductor-device mounting section of the socket. Next, the contact pins of the socket are moved toward the polishing chip, so as to bring the distal ends of the contact pins to be in contact with the abrasive layers 22 of the polishing portions 48a of the polishing chip, and cause them to slide on the surfaces of the abrasive layers 22. By the sliding movement, the distal ends of the contact pins of the socket are polished, whereby foreign substance adhered thereto are removed.

In the following, a polishing chip according to a sixth embodiment of the present invention will be explained.

The polishing chip of this embodiment is used for removal of foreign substances from a socket adapted for a final test (FIG. 19) in the evaluation testing apparatus.

Figure 25:
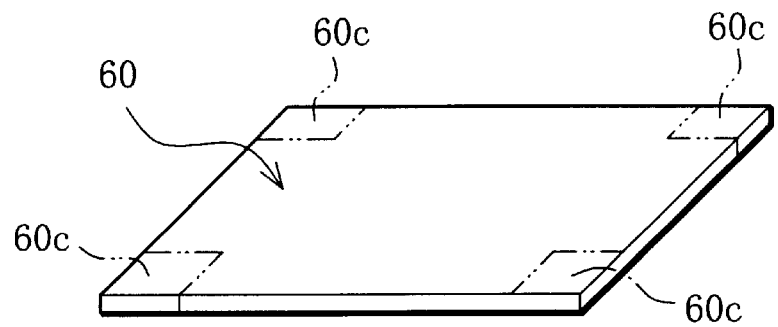
FIG. 25 is a perspective view of a polishing chip according to a sixth embodiment of the present invention.

As shown in FIG. 25, this polishing chip 60 comprises a polishing chip body having a rectangular planar shape which is substantially the same as that of the semiconductor device body, and an extension which is integral with the polishing chip body. The polishing chip is, as a whole, formed into a flat plate shape. The polishing chip extension, corresponding to outer peripheral portions of the plate-like polishing chip 60, extends laterally outwardly from outer edges of the polishing chip body in a plane in which the polishing chip body extends. The planar shape (rectangular frame shape) of the polishing chip extension is substantially the same as that of the entirety of the leads of the semiconductor device.

In FIG. 25, reference numeral 60c denotes notches which are formed, where required, at four corners of the polishing chip in accordance with the shape of the socket employed. Such notches 60c may be formed in a polishing chip applied to a socket provided at its corners with support columns, in order to avoid interference between the support columns of the socket and the polishing chip mounted to the socket.

The polishing chip 60 is fabricated by forming resin material, with which an abrasive is mixed, into a flat plate shape. As the abrasive, almina, iron oxide, silicon nitride, artificial diamond, ceramic, chrome, or green carbon may be used. As the resin material, urethane resin, urea resin, epoxy resin, silicon resin, or the like may be used. The polishing chip 60 has its thickness (for instance, about 100–130 micrometers) which is substantially the same as that of the polishing chip 21 shown in FIG. 3. As viewed in plan, the polishing chip 60 is substantially the same in shape and size as the semiconductor device 1 shown in FIG. 1 (the polishing chip 21 shown in FIG. 3).

The hardness of the resin material from which the polishing chip 60 is fabricated is appropriately selected in accordance with the manner of contact between the contact pins of the socket and the leads of the semiconductor device. For instance, for the fabrication of the polishing chip applied to the socket of a type where the contact pins have their sharpened tip ends enabled to be stuck into the leads of the semiconductor, it is preferable to use the resin material having a hardness permitting the tip ends of the contact pins to stick thereinto. Upon removal of foreign substances from the contact pins by use of the polishing chip 60, the tip ends of the contact pins are caused to stick several times into the polishing chip. At this time, the abrasive contained in the resin material, constituting part of the polishing chip 60 to which the tip ends of the contact pins are stuck, serves as the abrasive layer to polish the tip end portions of the contact pins to remove foreign substances adhered thereto.

In this manner, the polishing chip formed from resin material mixed with abrasive reduces the number of steps of polishing-chip fabrication process and hence reduces fabrication costs as compared to the case where the surface of a sheet material is coated with the abrasive layer.

In the following, a polishing chip according to a seventh embodiment of the present invention will be explained.

The polishing chip of this embodiment is common to the sixth embodiment in that it is fabricated from resin material mixed with abrasive, but is different in shape of the polishing chip body therefrom. That is, the polishing chip body of this embodiment has an outer shape substantially the same as that of the semiconductor device body, whereas the polishing chip body of the sixth embodiment is formed into a plate-like shape.

Figure 26:
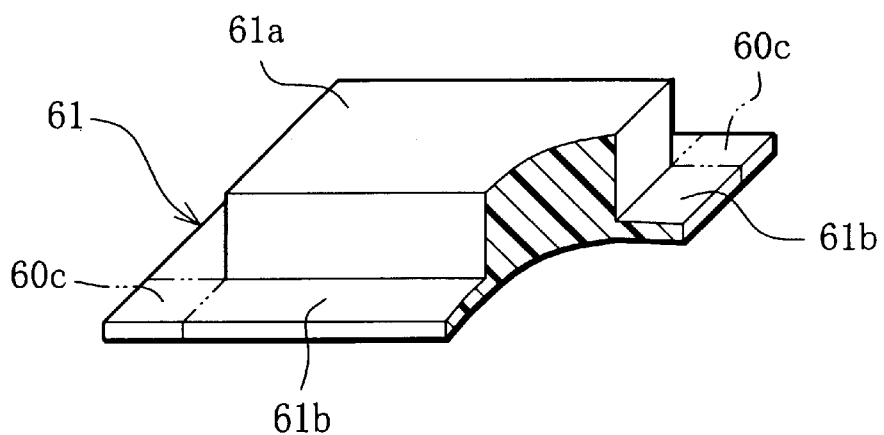
FIG. 26 is a perspective view showing, partly broken away, a polishing chip according to a seventh embodiment of the present invention.

As shown in FIG. 26, the polishing chip 61 of this embodiment includes a polishing chip body 61a which is thick in thickness and which has its outer shape and size substantially the same as those of the semiconductor device body 2 shown in FIG. 1, and a polishing chip extension 61b formed at a lower part of the polishing chip body integrally therewith along the entire periphery of polishing chip body. An upper face of the polishing chip body 61a serves as a pickup face for an automatic mounter of a suction-pickup type in case where the polishing chip 61 is mounted to the socket by use of the mounter which is usually employed to mount semiconductor devices to the socket. The polishing chip body 61a having outer shape and dimension thereof substantially the same as those of the semiconductor device body 2 permits the mounter to be utilized for mounting and dismounting the polishing chip 61 to and from the socket, to thereby improve the efficiency of mounting and dismounting the polishing chip.

In the following, a polishing chip according to an eighth embodiment of the present invention will be explained.

The polishing chip of this embodiment is common to the seventh embodiment in that it comprises a polishing chip body having an outer shape thereof substantially the same as that of the semiconductor device body, but is different in shape of a polishing chip extension therefrom. The polishing chip extension of this embodiment has its outer shape substantially the same as that of the entirety of the leads of the semiconductor device, whereas the polishing chip extension of the seventh embodiment is substantially the same solely in planar shape as the leads.

Figure 27:
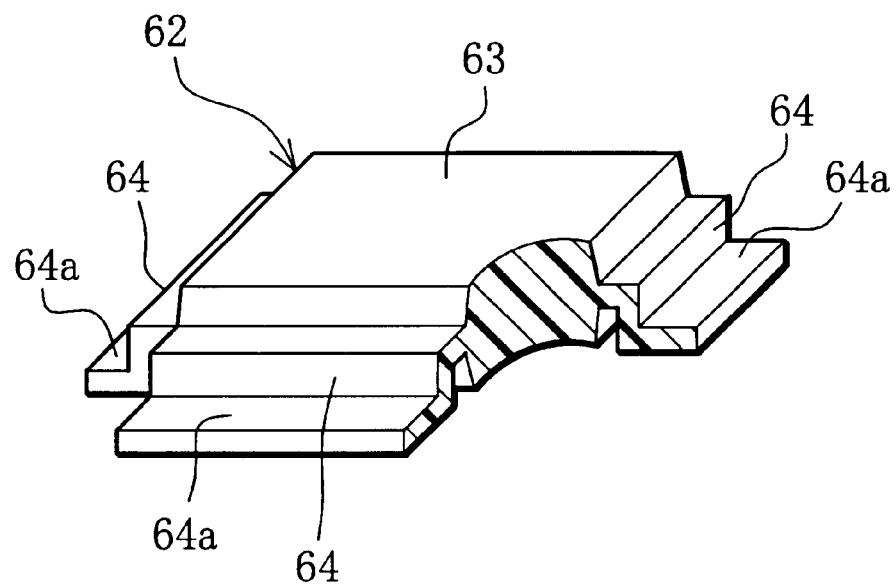
FIG. 27 is a perspective view showing, partly broken away, a polishing view according to an eighth embodiment of the present invention.

As shown in FIG. 27, the polishing chip 62 of this embodiment is fabricated by forming resin material mixed with an abrasive. The polishing chip body 63 has its outer shape substantially the same as that of the semiconductor device body 2 shown in FIG. 3, and is provided with four polishing chip extensions 64 formed integrally with the polishing chip body 63. Each extension 64 includes a horizontal portion thereof extending laterally outwardly from a vertically central position of a corresponding one of front, rear, left, and right side faces of the polishing chip body 63, a vertical portion thereof extending vertically downwardly from an outer edge of the horizontal portion, and a horizontal distal end portion 64a thereof extending laterally outwardly from a lower edge of the vertical portion. The extension 64 is, as a whole, formed into a crank shape which is substantially the same as the outer shape of leads 3 of the semiconductor device. The abrasive mixed in the resin material constituting a distal end portion 64a of the polishing chip extension 64 serves as the abrasive layer.

Figure 15:
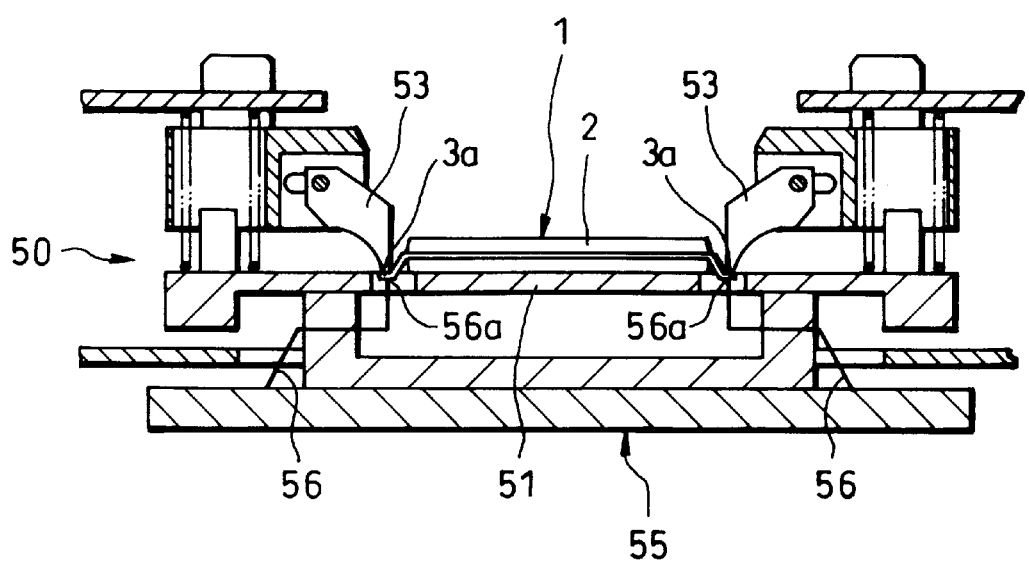
FIG. 15 is a vertical section view showing the probe socket and the semiconductor device in a state that the contact pins of the probe socket are in contact with the leads of the semiconductor device.

The polishing chip 62 having its outer shape substantially the same as that of the semiconductor device 1 can be employed to remove foreign substances from the contact pins of the socket 11 of a type shown in FIGS. 1 and 2 and having the socket body formed at its upper face 13a with positioning portions 13b and from the contact pins of the probe socket 55 for final test shown in FIGS. 14 and 15. With use of a suction-pickup type automatic mounter, the polishing chip 62 can be efficiently mounted and dismounted to and from the socket.

The polishing chip 62 of this embodiment makes it easy to soften the hardness of the abrasive layer as compared to the polishing chip in which the abrasive layer is applied to the surface of the sheet material. In particular, the polishing chip 62 can prevent the distal end portions 56a of the contact pins from being worn upon removal of foreign substances from the pointed contact pins 56 of the socket for final test shown in FIG. 14, whereby the durability of the contact pins can be improved.

In the following, a polishing chip according to a ninth embodiment of the present invention will be explained.

The polishing chip of this embodiment is common to the fifth embodiment in that it is adapted for removal of foreign substances from the contact pins of the socket to which semiconductor devices of a CSP/BGA type are mounted, but is different in how to combine the body and the extension of the polishing chip. The body and the extension of the polishing chip of this embodiment are integrally formed by forming resin material mixed with an abrasive, whereas the extension 48 is affixed to the body 49 in the polishing chip of the fifth embodiment.

Figure 28:
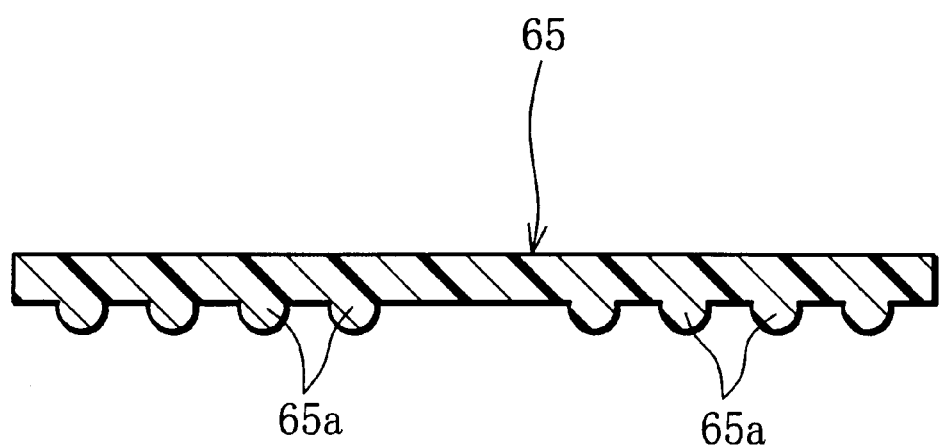
FIG. 28 is a sectional view of a polishing chip according to a ninth embodiment of the present invention.

As shown in FIG. 28, the polishing chip 65 of this embodiment comprises a plate-like main body (polishing chip body) having an outer shape thereof substantially the same as that of the semiconductor device body, and a plurality of ball-shaped polishing portions (polishing chip extensions) 65a formed in a lower face of the main body. As a whole, the polishing chip 65 is substantially the same in outer shape as the semiconductor device of a CSP/BGA type. The polishing portions 65a are arranged in a grid array as with the semi-spherical lead electrodes of the semiconductor device, and, as a whole, have an outer shape thereof substantially the same as that of the entirety of the plurality of semi-spherical lead electrodes of the semiconductor device. The abrasive mixed in the resin material forming the polishing portions 65a serves as the abrasive layer.

The polishing chip 65 of this embodiment, having the body and the extensions thereof formed into one piece, requires a lesser number of dies for fabrication of the polishing chip, as compared to the case of the polishing chip 48 of the fifth embodiment shown in FIG. 24. The polishing chip 65, fabricated from resin material mixed with abrasive, can offer the abrasive layer 22 that is softer in hardness than that of the polishing chip 48 fabricated from a sheeting coated with the abrasive layer 22. Thus, polishing-chip fabrication dies are subject to lesser wear-out, thereby contributing to a reduction in fabrication costs. Also, this prevents the tip end portions 56a of the pointed contact pins 65 of the socket for final test from being worn out upon removal of foreign substances therefrom, improving the durability of the contact pins. Thus, the number of times of using the socket can be increased, resulting in a reduction in equipment costs.

Although the polishing chip 65 has its polishing portions 65a formed into a ball-like shape so as to conform to ball-shaped lead terminals of the BGA type semiconductor device, the polishing portions of the polishing chip may be formed into a plate-like shape, which are circular or rectangular shape in transverse cross section, in the case of the polishing chip applied to a socket adapted for semiconductor devices of a type having plate-like lead terminals.

What is claimed is:

1. In a polishing chip detachably mounted to a semiconductor-device mounting section of a socket installed in a testing apparatus for evaluating semiconductor devices, the socket for use with the polishing chip including a plurality of contact pins which are disposed for contact with a plurality of leads of a semiconductor device mounted to the semiconductor-device mounting section of the socket, the polishing chip comprising:

a polishing chip body corresponding to a body of the semiconductor device, and a polishing chip extension having an abrasive layer and corresponding to the plurality of leads of the semiconductor device;

wherein the polishing chip body has a planar shape thereof substantially the same as a planar shape of the semiconductor device and has a height thereof substantially equal to or less than a height of the semiconductor device;

the polishing chip extension has a planar shape thereof substantially the same as a planar shape of a whole of the plurality of leads of the semiconductor device; and the plurality of contact pins of the socket are disposed for contact with the abrasive layer of the polishing chip when the polishing chip is mounted to the semiconductor-device mounting section of the socket.

2. The polishing chip according to claim 1, wherein the polishing chip body has an outer shape thereof substantially the same as an outer shape of at least top-wall-side part of the semiconductor device body, and the polishing chip extension has an outer shape thereof substantially the same as an outer shape of a whole of the plurality of leads of the semiconductor device.

3. The polishing chip according to claim 1, wherein the polishing chip is fabricated by forming a sheeting having the abrasive layer.

4. The polishing chip according to claim 1, wherein the polishing chip is fabricated from resin material with which an abrasive is mixed.

5. The polishing chip according to claim 4, wherein the polishing chip body has an outer shape thereof substantially the same as an outer shape of the semiconductor device body.

6. The polishing chip according to claim 1, wherein the polishing chip is applied to the socket to which the semiconductor device having the plurality of leads extending from side faces of the semiconductor device body is mounted;

the polishing chip body has a top wall and at least one side wall formed integrally therewith; and the polishing chip extension extends from the at least one side wall of the polishing chip body.

7. The polishing chip according to claim 6, wherein the socket includes a socket body, and a lid member disposed to face the socket body and to be movable vertically of the socket;

an accommodation space for selectively receiving either the semiconductor device body or the polishing chip body is provided between the socket body and the lid member, the accommodation space constituting part of the semiconductor-device mounting section of the socket;

the plurality of contact pins of the socket are disposed around the accommodation space, and have distal end portions thereof engageable with the lid member; and each contact pin is brought in contact with the abrasive layer when the lid member is moved toward the socket body in a condition that the polishing chip body is received in the accommodation space.

8. The polishing chip according to claim 7, wherein the plurality of leads of the semiconductor, the polishing chip extension, and the plurality of contact pins of the socket are formed into plate shapes, respectively; and the contact pins are brought in contact at their distal end faces with a flat surface of the abrasive layer of the polishing chip.

9. The polishing chip according to claim 7, wherein the socket body includes a positioning portion projecting vertically of the socket from a lid-member-side face of the socket body, and the positioning portion defines a lower part of the accommodation space.

10. The polishing chip according to claim 6, wherein the semiconductor-device mounting section of the socket includes a board on which either the semiconductor device body or the polishing chip body is selectively placed;

the board has a slot formed therethrough in a thickness direction of the board; and the abrasive layer of the polishing chip is disposed to face the slot of the board and the distal end portions of the plurality of contact pins of the socket are inserted into the slot and are disposed for contact with the abrasive layer when the polishing chip body is placed on the board.

11. The polishing chip according to claim 1, wherein the polishing chip is applied to the socket for receiving the semiconductor device having the plurality of leads consisting of lead electrodes that are formed in a grid array on a lower face of the semiconductor device body;

the polishing chip body has a lower face;

the polishing chip extension has a plurality of polishing portions formed in a grid array on the lower face of the polishing chip body; and the plurality of polishing portions are formed with the abrasive layer.

12. The polishing chip according to claim 11, wherein the polishing chip is fabricated from resin material with which an abrasive is mixed.

13. The polishing chip according to claim 12, wherein the polishing chip body has an outer shape thereof substantially the same as an outer shape of the semiconductor device body; and the polishing chip extension has an outer shape thereof substantially the same as an outer shape of a whole of the plurality of leads of the semiconductor device.

\* \* \* \* \*